United States Patent
Haggag et al.

(10) Patent No.: US 8,325,522 B2
(45) Date of Patent: Dec. 4, 2012

(54) MEMORY ARRAY OF FLOATING GATE-BASED NON-VOLATILE MEMORY CELLS

(75) Inventors: Hosam Haggag, Mountain View, CA (US); Alexander Kalnitsky, San Francisco, CA (US); Edgardo Laber, San Jose, CA (US); Michael D. Church, Canyon Lake, FL (US); Yun Yue, Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 3 days.

(21) Appl. No.: 13/012,361

(22) Filed: Jan. 24, 2011

(65) Prior Publication Data

US 2011/0116318 A1    May 19, 2011

Related U.S. Application Data

(62) Division of application No. 11/861,111, filed on Sep. 25, 2007, now Pat. No. 7,903,465.

(60) Provisional application No. 60/913,591, filed on Apr. 24, 2007.

(51) Int. Cl.
*G11C 16/04* (2006.01)
*G11C 16/06* (2006.01)
(52) U.S. Cl. ............... 365/185.05; 365/185.18; 365/184
(58) Field of Classification Search ............. 365/185.05, 365/185.18, 185.1, 51, 63, 72, 184
See application file for complete search history.

(56) References Cited

U.S. PATENT DOCUMENTS

| | | | |
|---|---|---|---|
| 4,432,072 A | 2/1984 | Chao et al. |
| 4,611,309 A | 9/1986 | Chuang et al. |
| 4,655,601 A | 4/1987 | Suzuki |
| 4,672,580 A | 6/1987 | Yau et al. |
| 5,465,231 A | 11/1995 | Ohsaki |
| 5,680,346 A | 10/1997 | Pathak et al. |
| 5,687,118 A | 11/1997 | Chang |
| 5,719,427 A | 2/1998 | Tong et al. |
| 5,790,455 A | 8/1998 | Caywood |
| 5,880,991 A | 3/1999 | Hsu et al. |
| 5,923,589 A | 7/1999 | Kaida |
| 5,981,335 A | 11/1999 | Chi |
| 6,025,625 A | 2/2000 | Chi |
| 6,055,185 A | 4/2000 | Kalnitsky et al. |
| 6,064,595 A | 5/2000 | Logie et al. |
| 6,081,451 A | 6/2000 | Kalnitsky et al. |
| 6,100,560 A | 8/2000 | Lovett |

(Continued)

*Primary Examiner* — John H Hur
(74) *Attorney, Agent, or Firm* — Fogg & Powers LLC

(57) ABSTRACT

A memory array comprises a plurality of memory cells organized in a matrix of rows and columns. Each of the memory cells includes a high voltage access transistor, a floating gate memory transistor electrically connected to the access transistor, and a coupling capacitor electrically connected to the memory transistor. A first set of word lines are each electrically connected to the capacitor in each of the memory cells in a respective row. A second set of word lines are each electrically connected to the access transistor in each of the memory cells in a respective row. A first set of bit lines are each electrically connected to the access transistor in each of the memory cells in a respective column. A second set of bit lines are each electrically connected to the memory transistor in each of the memory cells in a respective column. Various combinations of voltages can be applied to the word lines and bit lines in operations to program, erase, read, or inhibit a logic state stored by the memory transistor in one or more of the memory cells.

11 Claims, 3 Drawing Sheets

U.S. PATENT DOCUMENTS

| | | |
|---|---|---|
| 6,118,691 A | 9/2000 | Kalnitsky et al. |
| 6,122,204 A | 9/2000 | Poplevine et al. |
| 6,130,840 A | 10/2000 | Bergemont et al. |
| 6,137,721 A | 10/2000 | Kalnitsky et al. |
| 6,137,722 A | 10/2000 | Kalnitsky et al. |
| 6,137,723 A | 10/2000 | Bergemont et al. |
| 6,137,724 A | 10/2000 | Kalnitsky et al. |
| 6,141,246 A | 10/2000 | Derman et al. |
| 6,157,574 A | 12/2000 | Kalnitsky et al. |
| 6,222,764 B1 | 4/2001 | Kelley et al. |
| 6,271,560 B1 | 8/2001 | Kalnitsky et al. |
| 6,278,635 B1 | 8/2001 | Hara |
| 6,396,745 B1 * | 5/2002 | Hong et al. ............ 365/185.28 |
| 6,457,108 B1 | 9/2002 | Hsu |
| 6,512,691 B2 | 1/2003 | Hsu et al. |
| 6,512,700 B1 | 1/2003 | McPartland et al. |
| 6,566,683 B1 | 5/2003 | Ogawa et al. |
| 6,617,637 B1 | 9/2003 | Hsu et al. |
| 6,654,284 B2 | 11/2003 | Hsu et al. |
| 6,747,890 B1 | 6/2004 | Kirihata et al. |
| 6,757,196 B1 | 6/2004 | Tsao et al. |
| 6,795,347 B2 | 9/2004 | Ausserlechner et al. |
| 6,812,083 B2 | 11/2004 | Shen et al. |
| 6,888,192 B2 | 5/2005 | Lojek |
| 6,965,142 B2 | 11/2005 | Diorio et al. |
| 7,046,549 B2 | 5/2006 | Lee et al. |
| 7,071,507 B2 | 7/2006 | Diorio et al. |
| 7,099,192 B2 | 8/2006 | Wang et al. |
| 7,205,598 B2 | 4/2007 | Voshell et al. |
| 7,283,390 B2 | 10/2007 | Pesavento |
| 7,333,362 B2 | 2/2008 | Gendrier et al. |
| 7,397,078 B2 | 7/2008 | Solo De Zaldivar |
| 7,423,903 B2 | 9/2008 | Lin |
| 7,449,754 B2 | 11/2008 | Moore |
| 7,542,342 B2 | 6/2009 | Kalnitsky |
| 7,633,810 B2 | 12/2009 | Fang |
| 7,688,627 B2 | 3/2010 | Haggag et al. |
| 7,773,423 B1 | 8/2010 | Bu |
| 7,903,465 B2 | 3/2011 | Haggag |
| 2002/0121654 A1 | 9/2002 | Yamamoto |
| 2002/0191439 A1 * | 12/2002 | Caywood ............ 365/185.06 |
| 2006/0067124 A1 | 3/2006 | Lee et al. |
| 2006/0281247 A1 | 12/2006 | De Zaldivar |
| 2007/0109861 A1 | 5/2007 | Wang et al. |
| 2007/0121381 A1 | 5/2007 | Kalnitsky et al. |
| 2007/0247915 A1 | 10/2007 | Kalnitsky et al. |
| 2008/0266959 A1 | 10/2008 | Haggag et al. |

* cited by examiner

MEMORY ARRAY OF FLOATING GATE-BASED NON-VOLATILE MEMORY CELLS

This application is a divisional application of U.S. Ser. No. 11/861,111, filed on Sep. 25, 2007, the disclosure of which is incorporated by reference. This application also claims the benefit of priority to U.S. Provisional Application No. 60/913,591, filed on Apr. 24, 2007, the disclosure of which is incorporated by reference.

BACKGROUND

Non-volatile memory devices are used in applications that require stored information to be retained even when the memory devices are not powered. Examples of non-volatile memory devices include read-only memory (ROM), magnetic computer storage devices (e.g., hard disks, floppy disk drives), optical disc drives, erasable programmable read-only memory (EPROM), electrically erasable programmable read-only memory (EEPROM), and flash memory.

EEPROMs have been widely used in electronic products because of their non-volatile functions of electrically writing and erasing data. An EEPROM can be programmed and erased electrically. Flash memory is like EEPROM in that it can also be electrically erased and programmed. Flash memory stores information in an array of floating gate transistors, called "cells," each of which traditionally stores one bit of information. Newer flash memory devices, sometimes referred to as multi-level cell devices, can store more than 1 bit per cell by using more than two levels of electrical charge placed on the floating gate of a cell.

A limitation of conventional flash memory is that although it can be read or programmed a byte or a word at a time in a random access fashion, the flash memory has to erase multiple memory locations ("blocks") at a time. Changing a single byte is only possible by rewriting a whole block. Starting with a freshly erased block, any location within that block can be programmed. However, once a bit has been set to 0, only by erasing the entire block can it be changed back to 1. In other words, conventional flash memory offers random-access read and programming operations, but cannot offer arbitrary random-access rewrite or erase operations.

Another limitation of conventional flash memory as applied to standard complementary metal oxide semiconductor (CMOS) processes is the number of additional masking operations required to embed a flash cell and the peripheral circuitry used in generation and routing of high voltage signals.

SUMMARY

The present invention is related to a memory array comprising a plurality of memory cells organized in a matrix of rows and columns. Each of the memory cells includes a high voltage access transistor, a floating gate memory transistor electrically connected to the access transistor, and a coupling capacitor electrically connected to the memory transistor. A first set of word lines are each electrically connected to the coupling capacitor in each of the memory cells in a respective row. A second set of word lines are each electrically connected to the access transistor in each of the memory cells in a respective row. A first set of bit lines are each electrically connected to the access transistor in each of the memory cells in a respective column. A second set of bit lines are each electrically connected to the memory transistor in each of the memory cells in a respective column. Various combinations of voltages can be applied to the word lines and the bit lines in operations to program, erase, read, or inhibit a logic state stored by the memory transistor in one or more of the memory cells.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

DETAILED DESCRIPTION

Figure 1:
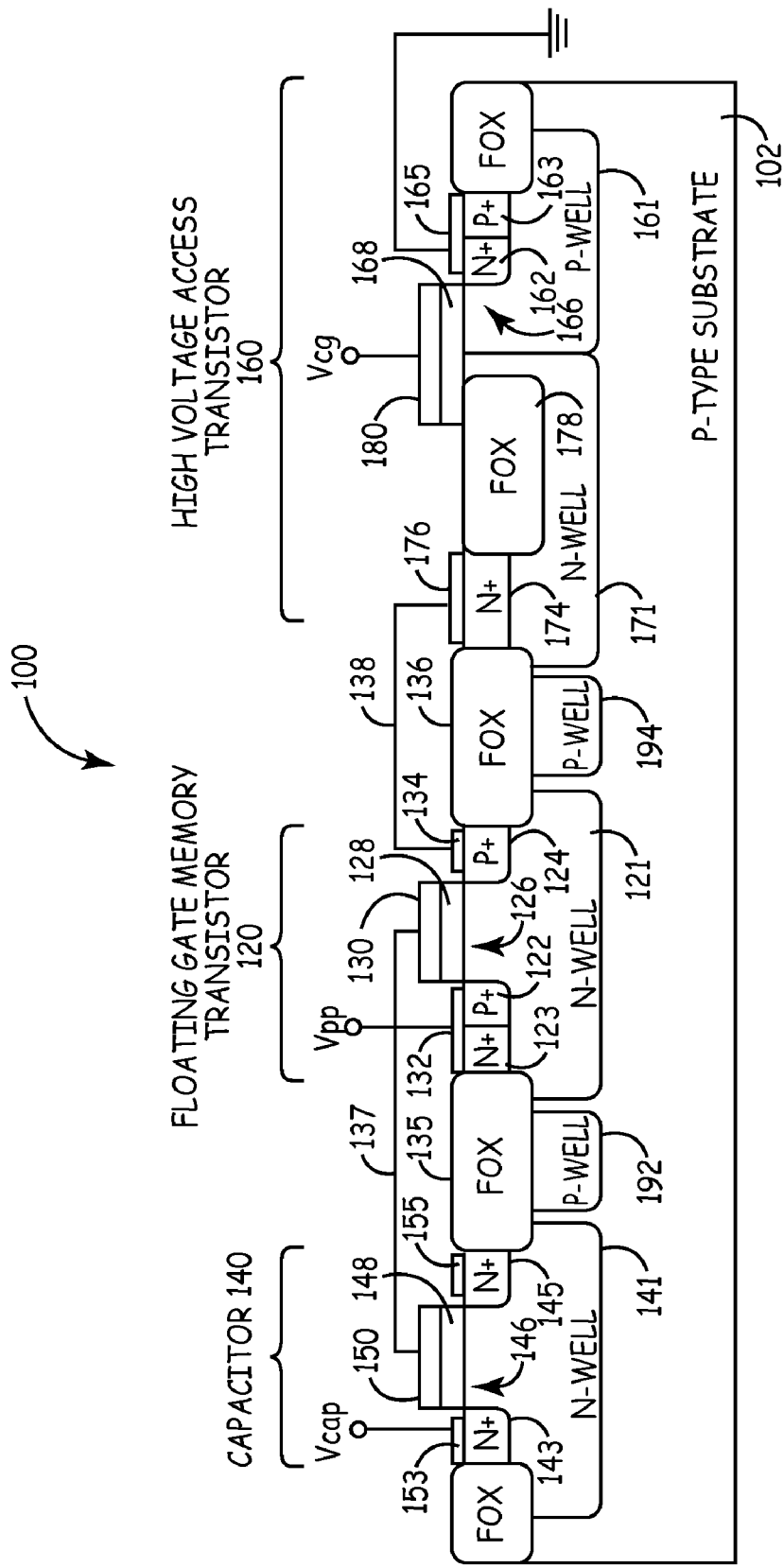
FIG. 1 is a schematic cross section view of a multiple time programmable memory cell according to one embodiment.

In the following detailed description, embodiments are described in sufficient detail to enable those skilled in the art to practice the invention. It is to be understood that other embodiments may be utilized without departing from the scope of the present invention. The following detailed description is, therefore, not to be taken in a limiting sense.

The complementary metal oxide semiconductor (CMOS) fabrication technology is a common fabrication technique for integrated circuits such as a p-channel and an re-channel MOSFET (metal oxide semiconductor field-effect transistor) referred to herein as PMOS and NMOS, respectively. Since CMOS technology continues to use 5V input-output (I/O) devices with a gate dielectric thickness in the range of about 10-15 nm, it is necessary to operate a memory cell at high positive erase voltages (e.g., about 12 V to about 22 V).

The present invention is directed to a three transistor (3T) memory array that is built with PMOS floating gate-based non-volatile memory cells. The present memory array can be fabricated using conventional CMOS technology with a thick gate oxide (e.g., about 125 Å). The memory cell and access transistor in the memory array can tolerate relatively high erase voltages. The memory array is suitable for embedding in a general purpose CMOS process with arbitrarily thick I/O gate oxide as the array does not require any additional processing. For example, the memory array can be employed in EEPROM or in a flash memory device embedded in a generic CMOS process with no additional masking and processing operations.

The present invention addresses the limitations of conventional flash memory by providing a memory cell and access transistor built out of elements native to a CMOS technology. High voltage routing can be accomplished by devices capable of sustaining required voltages on one terminal (drain) only, such as extended drain or drift metal oxide semiconductor (DMOS) devices or true high voltage (HV) CMOS devices if present in a given process. For applications that can tolerate the 'block' erase function, the entire memory (cell array, erase charge pump, program charge pump, decoders) can be constructed from devices with standard I/O oxide thickness.

The PMOS-based memory array is constructed with a three transistor architecture in each memory cell, including a storage transistor, a coupling capacitor, and an access transistor. The programming event of the PMOS-based memory cell is defined as its transfer to the conductive state. The program operation of the memory cell (i.e., injection and trapping of negative charges on the floating gate) can be accomplished by the channel hot carrier injection of secondary electrons generated by impact ionization at the drain of the floating gate PMOS punch-thru event (i.e., avalanche programming). The erase operation, which provides removal of electrons stored in the PMOS floating gate that renders the PMOS non-conductive, is accomplished by Fowler-Nordheim tunneling. The present memory array can be operated in a mode that allows byte by byte (and down to bit level) programming and erase.

Further details of the present invention are described as follows with respect to the drawings.

FIG. 1 depicts a cross section of a multiple time programmable (MTP) PMOS floating-gate based non-volatile memory cell 100 that can be employed in the memory array of the present invention. All elements of memory cell 100 can be built out of components intrinsic to a generic CMOS process flow with thick I/O oxide devices. The memory cell 100 generally includes a floating gate memory transistor 120, a coupling capacitor 140, and a high voltage access transistor 160. Each of these components is discussed in further detail hereafter.

The memory transistor 120 includes a p-type source region 122 spaced apart from a p-type drain region 124, both of which are formed in an n-type well 121 (N-well). The n-type well 121 is in turn formed in a p-type substrate 102. A channel region 126 is defined between source region 122 and drain region 124. A layer of gate oxide 128 is formed over channel region 126, and a floating gate 130 such as a layer of polysilicon is formed over gate oxide 128. Since gate 130 is isolated, it is often referred to as a floating gate. An n-type region 123 is also formed within n-type well 121 adjacent to p-type source region 122. The n-type region 123 provides an ohmic body tie to n-type well 121, so n-type well 121 can be tied to a terminal. A contact region 132 such as a layer of silicide is formed over p-type source region 122 and n-type region 123. A layer of silicide 134 can also be formed over p-type drain region 124. Silicide formation may be optionally excluded from the floating gate area by application of a conventional silicide block process. A field oxide (FOX) region 136 isolates memory transistor 120 from high voltage access transistor 160.

In the embodiment shown in FIG. 1, memory transistor 120 is a floating gate PMOS transistor. The memory transistor 120 may also be referred to as a storage transistor, because it can be programmed to store a logic state.

The coupling capacitor 140 includes spaced apart n-type diffusion regions 143 and 145 formed within an n-type well (N-well) 141, which is formed in p-type substrate 102. A channel region 146 is defined between n-type diffusion regions 143, 145, and a layer of gate oxide 148 is formed over channel region 146. A polysilicon top plate gate layer 150 is formed over gate oxide 148 to form the coupling capacitor top plate. A contact region 153 such as a layer of silicide is formed over n-type diffusion region 143, and a layer of silicide 155 is formed over n-type diffusion region 145. A FOX region 135 isolates capacitor 140 from memory transistor 120. Alternatively, the coupling capacitor can be formed as a conventional PMOS transistor or a gated diode capacitor (not shown).

The high voltage access transistor 160 includes both a p-type well 161 (P-well) and an n-type well 171 (N-well). The n-type well 171 forms the drain of transistor 160, with an n-type region 174 providing an ohmic body tie to a silicide contact region 176. An n-type source region 162 is formed in p-type well 161. A channel region 166 is defined between n-type source region 162 and n-type well 171. A layer of gate oxide 168 is formed over part of the P-well and part of the N-well (including where they abut one another), and a gate 180 is formed over gate oxide 168, resulting in gate 180 being over channel 166. A p-type region 163 is also formed within p-type well 161, next to n-type source region 162. The p-type region 163 provides an ohmic body tie to p-type well 161 so that p-type well 161 is tied to ground.

A layer of silicide 165 is formed over n-type source region 162 and p-type region 163, to thereby form a contact region that is shown as being connected to ground. A FOX region 178 is formed in n-type well 171 to isolate silicide contact region 176 from gate 180. It is this isolation that enables access transistor 160 to withstand the higher voltages which occur during an erase operation.

In the embodiment shown in FIG. 1, high voltage access transistor 160 is a high voltage asymmetrical n-channel MOSFET (NDMOS) device. The high voltage access transistor 160 may also be referred to as a high voltage select transistor. Because of its extended drain 171, access transistor 160 can also be referred to as a high voltage extended drain NMOS transistor. Alternatively, an NDMOS device designed for optimum performance of a Bipolar CMOS DMOS (BCD) process can be employed as an access device. In a further alternative embodiment, if a technology supports a set of high voltage devices, these can be used as access transistors.

A symmetrical parasitic NDMOS device can also be used as an access transistor. This device will have two regions of field oxide under both edges of the gate polysilicon, with two N-wells used as S/D extensions and a P-well region entirely under the gate polysilicon region of the DMOS device (structure not shown).

A p-type well (P-well) 192 is used to electrically isolate n-type well 141 from n-type well 121, without contacting either of n-type well 121 or n-type well 141. Similarly, a p-type well (P-well) 194 can electrically isolate n-type well 121 from n-type well 171, without contacting either of n-type well 121 or n-type well 171. The inclusion of p-type wells 192, 194 separated from N-wells by a region of lightly doped Si allows for application of higher voltages by preventing punch-thru between the neighboring n-type wells 121, 141 and the neighboring n-type wells 121, 171. Because of their function, p-type wells 192, 194 can be referred to as isolation wells. A similar approach can be used to increase the breakdown voltage of the symmetrical or the asymmetrical NDMOS (i.e., P-well 161 can be separated from N-well 171 by a region of lightly doped Si).

In accordance with some embodiments of the present invention, each gate oxide layer 128, 148 and 168 can have a gate oxide thickness that is the same as the gate oxide thickness of CMOS devices that are used as I/O interface devices having an operating voltage of 5V. In other words, the thickness for gate oxide layers 128, 148 and 168 can be native to the fabrication process for 5V I/O devices. This enables capacitor 140 and transistors 120, 160 to be made using standard CMOS processes. For example, each gate oxide layer 128, 148 and 168 can have a thickness in the range of about 10-15 nm (i.e., about 100-150 Å). In some embodiments, the thickness of each gate oxide layer 128, 148 and 168 can be at least about 12 nm (i.e., at least about 120 Å). In other embodiments, a gate oxide layer thickness of up to about 20 nm (i.e., up to about 200 Å) can be used, enabling such embodiments to be useful with devices having even higher I/O voltages.

The memory cell 100 includes three terminals. A capacitor terminal (Vcap) is electrically connected to contact region 153 of capacitor 140. A program terminal (Vpp) is electrically connected to contact region 132 of memory transistor 120. The Vpp terminal can be used for both programming and erasing the memory cell. A control terminal (Vcg), also referred to as a select or access terminal, is electrically connected to gate 180 of access transistor 160.

The top plate 150 of capacitor 140 is electrically connected to floating gate 130 of memory transistor 120 by a trace 137. There is no contact to floating gate 130 of memory transistor 120. The capacitor 140 is designed to have a much higher capacitance (e.g., about 10 times) than that of memory transistor 120. The capacitor 140 capacitively couples floating gate 130 to n-type well 141. Thus, when a high erase voltage (e.g., about 14-22 V) is applied to the Vpp terminal, a voltage drop across gate oxide 128 forms a sufficient electric field for Fowler-Nordheim tunneling such that electrons are tunneled off floating gate 130. As also shown in FIG. 1, p-type drain region 124 of memory transistor 120 is electrically connected to n-type drain region 171 (through n-type region 174) of access transistor 160 by a trace 138. Use of the NDMOS access transistor allows high voltages required for cell erase to be applied to the Vpp terminal without causing two junctions (N-well-P+ in the memory device in series with the N-well-P-well or N-well to substrate) breakdown.

Further details with respect to memory cell 100, including additional alternative embodiments, are described in copending U.S. application Ser. No. 11/498,672, filed on Aug. 2, 2006, the disclosure of which is incorporated herein by reference.

Figure 2:
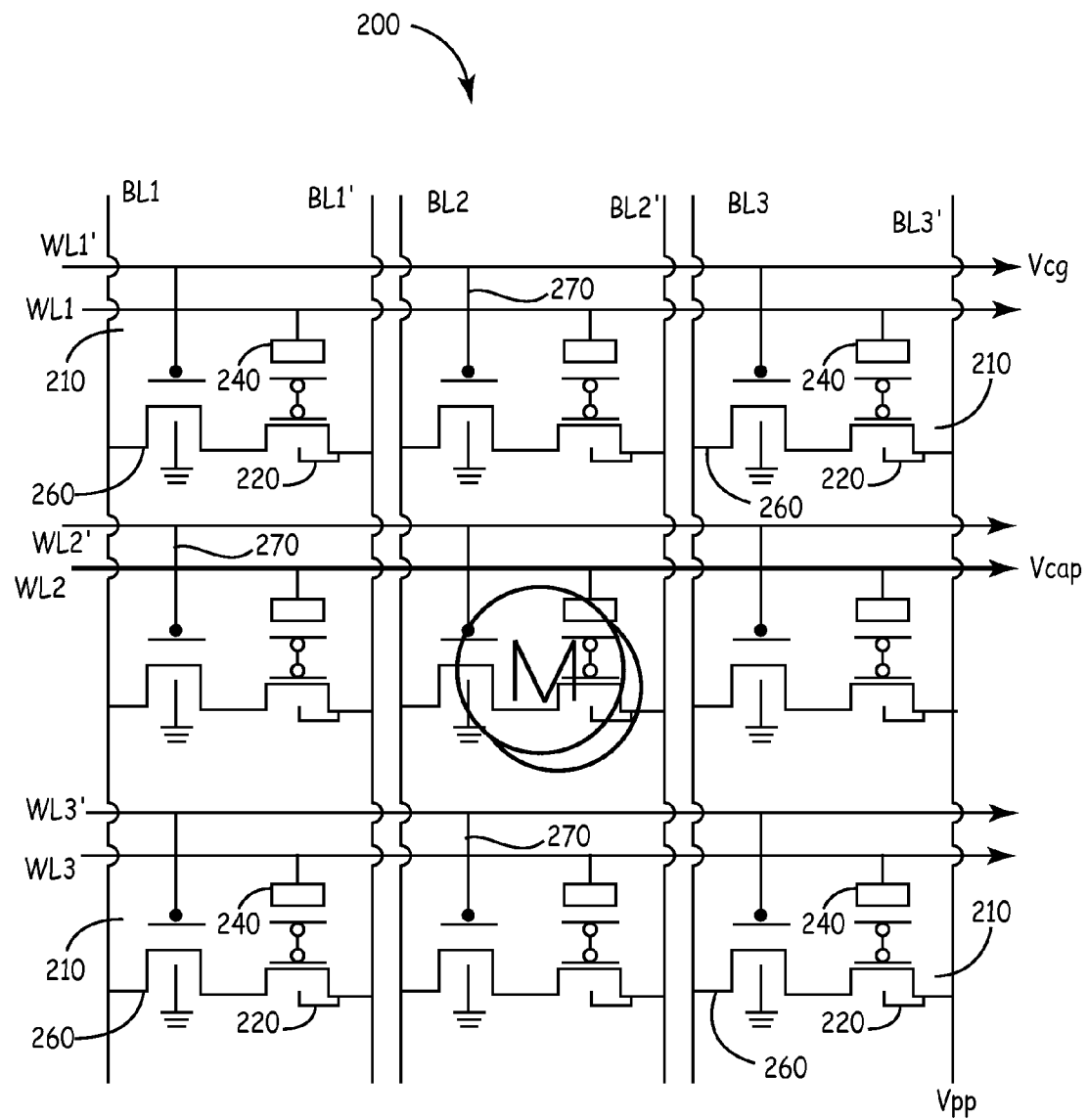
FIG. 2 is a schematic representation of a memory array according to one embodiment.

FIG. 2 is a schematic representation of a two-dimensional 3T memory array 200 according to one embodiment of the invention. The memory array 200 includes a plurality of memory cells 210 that are organized in a matrix of rows and columns. Although three rows and three columns are shown, it should be understood that any number of rows and columns of memory cells can be formed, and is only limited by the number of cells that can be formed on a particular chip.

Each of memory cells 210 includes a floating gate memory transistor 220, a coupling capacitor 240, and a high voltage access transistor 260, which can respectively correspond to memory transistor 120, capacitor 140, and access transistor 160 discussed with respect to FIG. 1. The floating gate memory transistor 220 is electrically connected to high voltage access transistor 260. The floating gate memory transistor 220 is configured to store a logic state. The coupling capacitor 240 is electrically connected to memory transistor 220. The access transistor can be a parasitic symmetrical or asymmetrical NDMOS or a high voltage device if present in a given technology.

The memory cells 210 are connected together in a matrix by word lines and bit lines arranged in a plurality of rows and columns. A first set of word lines (WL1, WL2, WL3, ... WLx) each provides a Vcap bus line that is electrically connected to each capacitor 240 in a respective row. A second set of word lines (WL1', WL2', WL3', ... WLx') each provides a Vcg bus line that is electrically connected to each access transistor 260 in a respective row through a terminal 270.

A first set of bit lines (BL1, BL2, BL3, ... BLx) each provides a bus line that is electrically connected to each access transistor 260 in a respective column. A second set of bit lines (BL1', BL2', BL3', ... BLx') each provides a Vpp bus line that is coupled to each memory transistor 220 in a respective column. Various combinations of voltages can be applied to the word lines and the bit lines to program, inhibit, read, or erase the logic state stored by memory transistor 220 in one or more of the memory cells.

In a method of programming a single bit in a memory cell of memory array 200, a first voltage is applied to a word line, in the first set of word lines, connected to capacitor 240 of the memory cell to be programmed. A second voltage is applied to a word line, in the second set of word lines, connected to access transistor 260 of the memory cell to be programmed, with the second voltage being equal to the first voltage. A bit line, in the first set of bit lines, connected to access transistor 260 in the memory cell to be programmed is grounded. A third voltage is applied to a bit line, in the second set of bit lines, connected to memory transistor 220 of the memory cell to be programmed, with the third voltage being greater than the first voltage. The third voltage is sufficient to induce impact ionization current at the drain of memory transistor 220. The impact ionization current generates energetic electrons and holes that create avalanche multiplication. Bit lines, in the second set of bit lines, not connected to the memory cell to be programmed are grounded, and word lines, in the first set of word lines, not connected to the memory cell to be programmed are also grounded.

In a method of erasing a single bit in a memory cell of memory array 200, a word line, in the first set of word lines, connected to capacitor 240 of the memory cell to be erased is grounded. A word line, in the second set of word lines, connected to access transistor 260 of the memory cell to be erased is also grounded. A first voltage is applied to a bit line, in the second set of bit lines, connected to memory transistor 220 in the memory cell to be erased. A second voltage is applied to word lines, in the first set of word lines, not connected to the memory cell to be erased, with the second voltage being about one-half of the first voltage.

In a method of reading a single bit in a memory cell of memory array 200, a first voltage is applied to a bit line, in the second set of bit lines, connected to memory transistor 220 in the memory cell to be read. A second voltage is applied to a word line, in the second set of word lines, connected to access transistor 260 in the memory cell to be read, with the second voltage being greater than the first voltage. A word line, in the first set of word lines, connected to capacitor 240 of the memory cell to be read is grounded.

Further details regarding program, erase, and read operations for memory array 200 are discussed hereafter.

As mentioned previously, program operations in the memory array are carried out by channel hot carrier injection (avalanche programming), and erase operations in the memory array are carried out by Fowler-Nordheim (F-N) tunneling.

In order to program a memory cell 210, such as by hot carrier injection, a program voltage level is applied to the Vpp terminal, and a select voltage level is applied to the Vcg terminal and the Vcap terminal. The select voltage level should be sufficient to turn on access transistor 260. The program voltage level should be sufficient to induce avalanche multiplication at the drain of the floating gate of the memory transistor 220. For example, a positive voltage applied to the coupling capacitor creates an electric field that aids hot electron transport from a silicon layer into the floating gate.

The program voltage may be externally applied or generated on chip. The avalanche multiplication at the drain produces electron-hole pairs. Some of the electrons are hot enough to be injected into the floating gate of memory transistor 220 and are trapped therein to turn on memory transistor 220 (i.e., memory transistor state changes from nonconductive to conductive). The programming efficiency of this hot electron injection mechanism increases with the increased voltage on the coupling capacitor.

FIG. 2 further illustrates various operational functions at the bit level for memory array 200. The program voltage level can be about 5-15 V. A program condition for the programming function (e.g., avalanche programming) of a cell M in memory array 200 follows:

(1) To program cell M at WL=2 and BL=2:
WL2=WL2'=about 5V, BL2'=Vpp (on the order of about 10 V for the 0.5 u long PMOS storage device), BL2=0;
 a. Row inhibit: all cells on WL2 will see VWL2=WL2'=5V, program inhibit in this row must be achieved by applying BL1'=BL3'=0 V.
(2) If cell at WL=2 and BL=3 is programmed; then BL1' or BL3'=5V; not enough to erase;
 a. If an erased cell is on BL1' or BL3' sees 5V; don't care.
 b. Column inhibit: all cells on BL2' will see Vpp, WL1=WL3=0; no disturb in WL1 or WL2 for erased or programmed cells.

In order to erase a memory cell, an erase voltage that is sufficient to form the necessary electric field to induce F-N tunneling must be dropped across the gate dielectric of the memory transistor (storage PMOS). The erase voltage Vpp is applied to a BLx' terminal, while the Vcg terminal and the Vcap terminal are connected to ground. The erase voltage level can be about 14-22 V. The erase operation can be used to simultaneously erase all cells connected to a common Vpp bus.

A program condition for the erase function of cell M in memory array 200 at the bit level (e.g., bit at WL=2 and BL=2) follows:

(1) To erase: BL2'=about 17 V, WL2=WL2'=0V
 Erase inhibit: WL1=WL3=about ½ of the Vpp To inhibit programming or erasure of the memory cell, the Vcg terminal should be connected to ground.

The memory cell can be read by applying a significantly lower read voltage (e.g., approximately 1 V) to the Vpp terminal while the Vcg terminal receives a select voltage level.

A program condition for the read function of cell M in memory array 200 at the bit level follows:

(1) Read: BL2'=1 V, WL2'=5 V and Vcap=0

Figure 3:
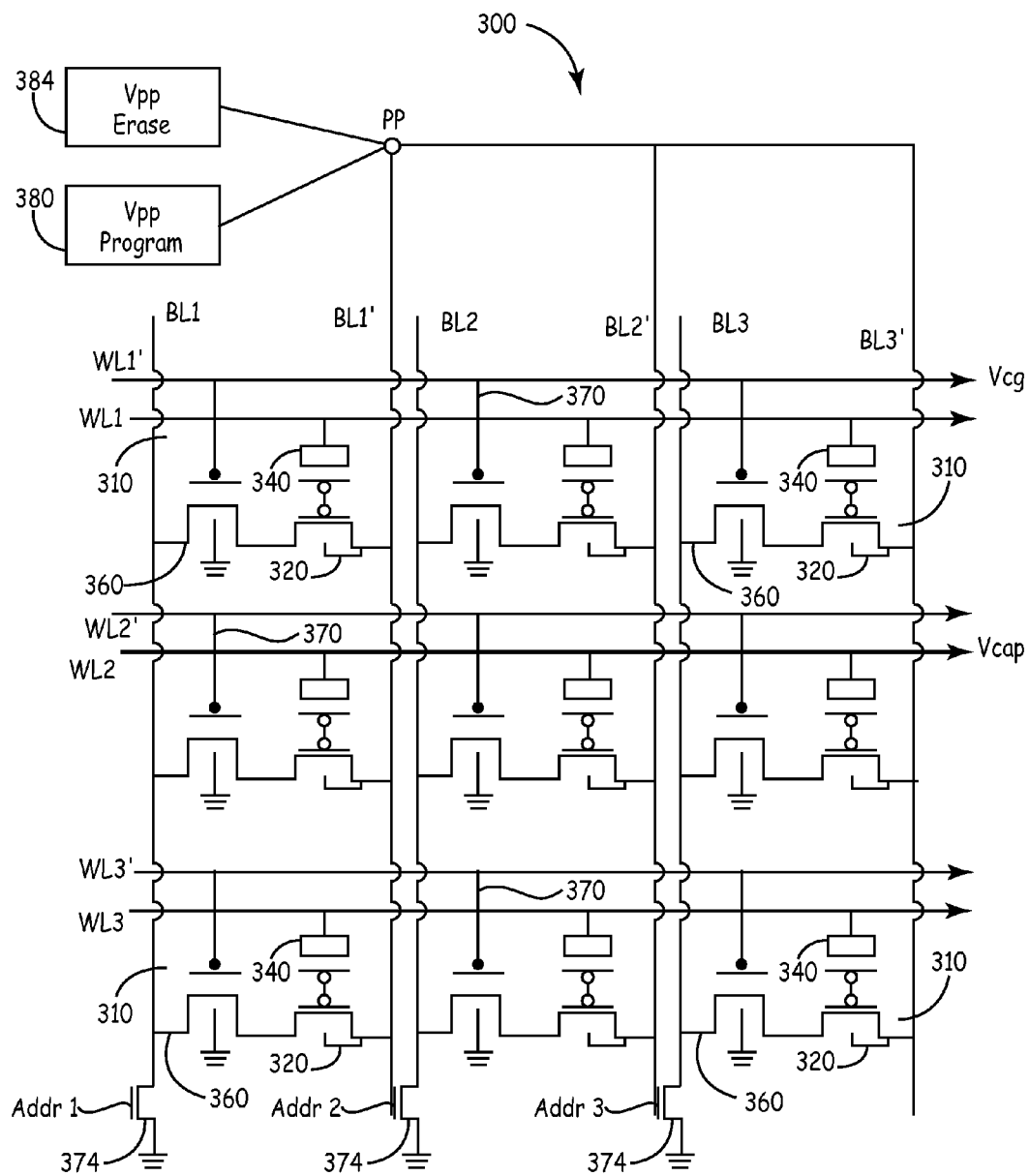
FIG. 3 is a schematic representation of a memory array according to another embodiment.

A memory array construction with a single point high voltage supply is of interest for embedded applications since it does not require specialized high voltage devices over and above the parasitic NDMOS access device naturally present in any CMOS technology. Such a memory array 300 is shown in FIG. 3 according to another embodiment of the invention. The memory array 300 includes a plurality of memory cells 310 that are organized in a matrix of rows and columns. Erase operations in memory array 300 are carried out by F-N tunneling, and program operations in memory array 300 are carried out by hot carrier injection.

Each of the memory cells 310 includes a floating gate memory transistor 320, a coupling capacitor 340, and a high voltage access transistor 360, which can respectively correspond to memory transistor 220, capacitor 240, and access transistor 260 discussed with respect to FIG. 2. The memory transistor 320 is electrically connected to access transistor 360. The coupling capacitor 340 is electrically connected to memory transistor 320.

The memory cells 310 are connected together in a matrix by word lines and bit lines arranged in a plurality of rows and columns. A first set of word lines (WL1, WL2, WL3, . . . WLx,) each provides a Vcap bus line that is electrically connected to each capacitor 340 in a respective row. A second set of word lines (WL1', WL2', WL3', . . . WLx') each provides a Vcg bus line that is electrically connected to each access transistor 360 in a respective row through a terminal 370. A first set of bit lines (BL1, BL2, BL3, . . . BLx) each provides a bus line that is electrically connected to each access transistor 360 in a respective column.

The access transistors 360 in memory array 300 can be symmetrical NDMOS devices. Such access devices connected to the same bit line BLx are placed in series with a low voltage column address transistor 374 in each column. The column address transistor 374 is isolated from high voltage by the symmetrical NDMOS devices.

A second set of bit lines (BL1', BL2', BL3', . . . BLx') are all connected together and routed to a single voltage supply point PP where high voltages required for cell programming and erasure are supplied. Program and erase voltages can be respectively generated by a Vpp program charge pump 380 and a Vpp erase charge pump 384, which can be constructed entirely of low voltage devices.

In a method of programming a single bit in a memory cell of memory array 300, a program voltage is applied to voltage supply point PP from program charge pump 380. A first voltage is applied to a word line, in the first set of word lines, connected to capacitor 340 of the memory cell to be programmed. A second voltage is applied to a word line, in the second set of word lines, connected to access transistor 360 of the memory cell to be programmed, with the second voltage equal to the first voltage. Word lines, in the first set of word lines, not connected to the memory cell to be programmed are grounded, and word lines, in the second set of word lines, not connected to the memory cell to be programmed are also grounded. The column address transistor 374 in the column supporting the memory cell to be programmed is activated.

In one implementation, programming is accomplished by application of the program Vpp to the voltage supply point PP, with WLx and WLx' lines along the programmed cell(s) biased to about 5 V, and the other WLx and WLx' lines at ground. The address transistor 374 in the column supporting the programmed bit is then activated. A write inhibit can be accomplished by grounding address (Addr) lines (1, 2, 3, etc.) in columns where writing is not needed.

In a method of erasing a single bit in a memory cell of memory array 300, an erase voltage is applied to voltage supply point PP from erase charge pump 384. A word line, in the first set of word lines, connected to capacitor 340 of the memory cell to be erased is grounded, and a word line, in the second set of word lines, connected to access transistor 360 of the memory cell to be erased is also grounded. A first voltage is applied to word lines, in the first set of word lines, not connected to the memory cell to be erased. A second voltage is applied to word lines, in the second set of word lines, not connected to the memory cell to be erased, with the second voltage being equal to the first voltage. The address transistor 374 in the column supporting the memory cell to be erased is grounded. The entire memory array 300 can be erased at once by application of a high Vpp (about 14-22 V) to voltage supply point PP with all WLx and WLx' lines grounded.

In a method of reading a single bit in a memory cell of memory array 300, a first voltage is applied to a bit line, in the second set of bit lines, connected to memory transistor 320 in the memory cell to be read. A second voltage is applied to a word line, in the first set of word lines, connected to capacitor 340 in the memory cell to be read, with the second voltage being greater than the first voltage. A word line, in the second set of word lines, connected to access transistor 360 of the memory cell to be read is grounded. Word lines, in the first set of word lines, not connected to the memory cell to be read are grounded, and word lines, in the second set of word lines, not connected to the memory cell to be read are also grounded. The column address transistor 374 in the column supporting the memory cell to be read is activated.

In one implementation, a read operation requires about 1 V on voltage supply point PP, and a word line WLx of the read row is biased to about 5 V. All other word lines WLx are at 0 V, and all word lines WLx' are at 0 V. A set of address signals are then sent to Addr line inputs for the memory cell(s) to be read.

The present invention may be embodied in other specific forms without departing from its essential characteristics. The described embodiments and methods are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A memory array comprising:
    a plurality of memory cells organized in a matrix of rows and columns, each of the memory cells comprising:
        a high voltage access transistor;
        a floating gate memory transistor electrically connected to the access transistor; and
        a coupling capacitor electrically connected to the memory transistor;
    a first set of word lines each electrically connected to the coupling capacitor in each of the memory cells in a respective row;
    a second set of word lines each electrically connected to the access transistor in each of the memory cells in a respective row;
    a first set of bit lines each electrically connected to the access transistor in each of the memory cells in a respective column;
    a second set of bit lines each electrically connected to the memory transistor in each of the memory cells in a respective column, the second set of bit lines each electrically connected together;
    a plurality of column address transistors each electrically connected to a bit line in the first set of bit lines;
    a single voltage supply point electrically connected to the second set of bit lines;
    a program charge pump electrically connected to the voltage supply point; and
    an erase charge pump electrically connected to the voltage supply point;
    wherein various combinations of voltages can be applied to the word lines and the bit lines in operations to program, erase, read, or inhibit a logic state stored by the memory transistor in one or more of the memory cells.

2. The memory array of claim 1, wherein the memory cells are organized in a two-dimensional array.

3. The memory array of claim 1, wherein the program operation is carried out by programming from impact ionization generated electrons, and the erase operation is carried out by Fowler-Nordheim tunneling.

4. The memory array of claim 1, wherein the single point voltage supply is configured to apply programming and erasure voltages.

5. The memory array of claim 1, wherein the access transistors comprise symmetrical NDMOS devices.

6. The memory array of claim 1, wherein the program charge pump is configured to generate a programming voltage.

7. The memory array of claim 1, wherein the erase charge pump is configured to generate an erasure voltage.

8. The memory array of claim 1, wherein the program charge pump and the erase charge pump are constructed entirely of low voltage devices.

9. The memory array of claim 1, wherein the high voltage access transistor comprises a gate oxide layer having a thickness of about 10-15 nm.

10. The memory array of claim 1, wherein the floating gate memory transistor comprises a gate oxide layer having a thickness of about 10-15 nm.

11. The memory array of claim 1, wherein the coupling capacitor comprises a gate oxide layer having a thickness of about 10-15 nm.

* * * * *